(12) United States Patent
Wang et al.

(10) Patent No.: US 8,262,891 B2
(45) Date of Patent: Sep. 11, 2012

(54) LEVELER COMPOUNDS

(75) Inventors: Deyan Wang, Hudson, MA (US);
Robert D. Mikkola, Grafton, MA (US);
George G. Barclay, Jefferson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1597 days.

(21) Appl. No.: 11/541,806

(22) Filed: Oct. 2, 2006

(65) Prior Publication Data

US 2007/0084732 A1    Apr. 19, 2007

Related U.S. Application Data

(60) Provisional application No. 60/722,747, filed on Sep. 30, 2005.

(51) Int. Cl.
*C25D 5/00* (2006.01)
*C25D 3/56* (2006.01)
*C25D 3/00* (2006.01)
*C25D 3/38* (2006.01)
*C23C 16/40* (2006.01)
*C23C 18/40* (2006.01)

(52) U.S. Cl. .......... 205/80; 205/238; 205/261; 205/296; 205/297; 106/1.25; 106/1.26

(58) Field of Classification Search .......... 205/80, 205/238, 261, 296, 297; 106/1.26, 1.25
See application file for complete search history.

(56) References Cited

U.S. PATENT DOCUMENTS

| | | | | |
|---|---|---|---|---|
| 3,502,551 A * | 3/1970 | Todt et al. | ...................... | 205/298 |
| 3,703,596 A * | 11/1972 | Marx et al. | ...................... | 524/548 |
| 3,843,667 A * | 10/1974 | Cupery | ...................... | 548/101 |
| 4,009,087 A | 2/1977 | Kardos et al. | ............... | 204/52 R |
| 4,038,161 A | 7/1977 | Eckles et al. | ............... | 204/54 R |
| 5,294,354 A | 3/1994 | Papke et al. | ............... | 252/18 |
| 5,607,570 A | 3/1997 | Rohbani | ............... | 205/297 |
| 5,840,170 A | 11/1998 | Nagy | ............... | 205/101 |
| 6,024,857 A | 2/2000 | Reid | ............... | 205/123 |
| 6,183,622 B1 | 2/2001 | Janik | ............... | 205/585 |
| 6,420,441 B1 | 7/2002 | Allen et al. | ............... | 571/77 |
| 6,425,996 B1 | 7/2002 | Dahms et al. | ............... | 205/298 |
| 6,610,192 B1 | 8/2003 | Step et al. | ............... | 205/297 |
| 6,676,823 B1 * | 1/2004 | Bokisa | ............... | 205/296 |
| 6,682,642 B2 | 1/2004 | Mikkola et al. | ............... | 205/296 |
| 6,787,601 B2 | 9/2004 | Lamola et al. | ............... | 524/714 |
| 6,903,175 B2 | 6/2005 | Gore et al. | ............... | 526/319 |
| 2002/0036144 A1 | 3/2002 | Lee et al. | ............... | 205/296 |
| 2003/0168343 A1 | 9/2003 | Commander et al. | ............... | 205/123 |
| 2004/0187731 A1 | 9/2004 | Wang et al. | ............... | 106/1.13 |
| 2005/0045486 A1 | 3/2005 | Sahoda et al. | ............... | 205/123 |
| 2005/0045488 A1 | 3/2005 | Paneccasio, Jr. et al. | ...... | 205/291 |
| 2005/0126919 A1 | 6/2005 | Kubota et al. | ............... | 205/125 |
| 2006/0016693 A1 | 1/2006 | Wang et al. | ............... | 205/291 |

FOREIGN PATENT DOCUMENTS

| | | |
|---|---|---|
| EP | 1 054 080 | 11/2000 |
| EP | 1 069 211 | 1/2001 |
| EP | 1 371 757 | 12/2003 |

OTHER PUBLICATIONS

Kara et al., "Immobilization of alpha-Amylase on Cu2+ Chelated Poly(ethylene glycol dimethacrylate-n-vinyl imidazole) Matrix via Adsorption", Reactive & Functional Polymers (Jan. 2005), vol. 62, pp. 61-68.*

European Search Report of Corresponding European Application No. 06 25 4928, May 4, 2007.

Ogawa et al.; "Stress-Induced Voiding Under Vias Connected to Wide Cu Metal Leads"; IEEE International Reliability Physics Symposium Proceedings (2002), $40^{th}$ pp. 312-321.

* cited by examiner

*Primary Examiner* — Edna Wong
(74) *Attorney, Agent, or Firm* — S. Matthew Cairns; John J. Piskorski

(57) ABSTRACT

Leveling agents for metal plating baths are provided. Plating baths containing such leveling agents provide metal deposits having substantially level surfaces. Such leveling agents may be selected to selectively incorporate desired levels of impurities into the metal deposit.

7 Claims, No Drawings

LEVELER COMPOUNDS

The present invention relates generally to the field of electrolytic metal plating compositions. In particular, the present invention relates to the field of copper electroplating compositions.

Metal layers are plated on a variety of substrates for a variety of purposes. Copper is used in the manufacture of many electronic devices. Methods for electroplating articles with metal such as copper generally involve passing a current between two electrodes in a plating solution where one of the electrodes is the article to be plated (typically the cathode). A typical acid copper electroplating solution comprises dissolved copper (usually copper sulfate), an acid electrolyte such as sulfuric acid in an amount sufficient to impart conductivity to the bath, and one or more additives to improve the quality of the copper deposit. Such additives include brighteners, levelers, surfactants and suppressors.

Plating a substrate having irregular topography can pose particular difficulties. During electroplating a voltage drop variation typically will exist along an irregular surface which can result in an uneven metal deposit. Plating irregularities are exacerbated where the voltage drop variation is relatively extreme, i.e., where the surface irregularity is substantial. As a result, a thicker metal deposit, termed overplating, is observed over such surface irregularities. Achieving a metal layer of substantially uniform thickness is frequently a challenging step in the manufacture of plated articles such as electronic devices. Leveling agents are often used in metal plating baths, particularly copper plating baths, to provide substantially uniform, or level, metal layers on a substrate surface.

The purity of an electrolytically deposited metal layer such as copper becomes important as the size of the electronic devices shrink. High levels of impurities in narrow interconnect lines will increase the resistivity of the metal as well as decreasing the useful lifetime of a device by early electromigration failure. Accordingly, the trend in the industry is toward metal plating baths, particularly copper electroplating baths, that provide purer copper deposits inside narrow interconnect lines in order to reduce the resistivity of the deposits and promote longer electro-migration lifetimes.

Stress-induced voiding occurs in copper deposits in dual damascene structures where voids are formed under vias that connect to wide metal lines. Such voiding leads to failures in the device. One theory attributes the formation of such voiding to vacancies that develop in the copper deposits when the copper is not properly annealed. Regardless of how such voiding occurs, the use of higher purity copper in the wide metal lines exacerbates the formation of such voiding. There is a need in the industry for copper deposits that do not form stress-induced voids.

EP 1 069 211 A2 discloses copper electroplating baths containing a leveling agent. A variety of leveling agents are disclosed, including polyacrylamide. This patent application fails to address the problem of stress induced voiding.

It has been surprisingly found that impurities can be selectively incorporated into metal deposits such as copper metal lines during electroplating of the metal layer. Such selective incorporation of impurities particularly in wide metal lines reduces the formation of stress-induced voids under vias connected to such metal lines.

In one embodiment, the present invention provides a composition including a source of metal ions, an electrolyte, and a polymeric leveling agent including as polymerized units an ethyleneically unsaturated nitrogen-containing heterocyclic monomer. Such composition may optionally include one or more of each of accelerators, suppressors, sources of halide ions, and grain refiners. Also provided by the present invention are certain polymeric leveling agents including as polymerized units 1-70 wt % of an ethyleneically unsaturated cross-linking agent, 5-80 wt % of an ethyleneically unsaturated nitrogen-containing heterocyclic monomer, and 5-80 wt % of a (meth)acrylate monomer. Other polymeric leveling agents include as polymerized units 5-90 wt % of an ethyleneically unsaturated nitrogen-containing heterocyclic monomer, and 10-95 wt % of a (meth)acrylate monomer.

In a further embodiment, the present invention provides a method of depositing a layer of metal on a substrate including the steps of contacting the substrate with the composition described above; and applying a current density for a period of time to deposit a metal layer on the substrate. The period of time is sufficient to deposit a metal layer of a desired thickness.

The present invention is useful for providing substantially planar metal deposits. Also, the present invention is useful for incorporating impurities at a desired level within a metal deposit. In particular, the present invention is useful in the manufacture of electronic devices, such as integrated circuits, and more specifically in the deposition of wide metal lines in the manufacture of integrated circuits.

As used throughout the specification, the following abbreviations shall have the following meanings: nm=nanometers; g/L=grams per liter; wt %=weight percent; $mA/cm^2$=milliamperes per square centimeter; μm=micron=micrometer; ppm=parts per million, mL/L=milliliter/liter; °C.=degrees Centigrade; sec.=seconds; msec.=milliseconds; g=grams; DC=direct current; and Å=Angstroms.

As used throughout the specification, "feature" refers to the geometries on a substrate. "Apertures" refer to recessed features, such as vias and trenches. As used throughout this specification, the term "plating" refers to metal deposition on a substrate. "Defects" refer to surface defects of a metal layer, such as protrusions and pits, as well as defects within a metal layer, such as voids. "Wide metal lines" refers to metal lines having a width of >1 μm. The terms "layer" and "film" are used interchangeably and refer to a metal deposit unless the context clearly indicates otherwise.

The term "alkyl" includes linear, branched and cyclic alkyl. The term "(meth)acrylic" includes both acrylic and methacrylic and the term "(meth)acrylate" includes both acrylate and methacrylate. Likewise, the term "(meth)acrylamide" refers to both acrylamide and methacrylamide. As used herein, the term "(meth)acrylate monomer" includes all types of (meth)acrylic, (meth)acrylate and (meth)acrylamide monomers. "Polymer" and "polymeric" refer to polymers and oligomers and include homopolymers and copolymers. The terms "oligomer" and "oligomeric" refer to dimers, trimers, tetramers and the like. "Monomer" refers to any ethyleneically or acetyleneically unsaturated compound capable of being polymerized. Such monomers may contain one or more double or triple bonds. Monomers containing two or more double or triple bonds capable of being polymerized are referred to as "cross-linking agents." The terms "cross-linking agent" and "cross-linker" are used interchangeably.

"Accelerator" refers to an organic additive that increases the plating rate of a metal during electroplating. "Suppressor" refers to an organic additive that suppress the plating rate of a metal. "Leveler" refers to an organic additive that is capable of providing a substantially planar metal layer. The terms "leveler" and "leveling agent" are used interchangeably throughout this specification. The term "halide" refers to fluoride, chloride, bromide and iodide.

The indefinite articles "a" and "an" are intended to include both the singular and the plural. All percentages and ratios are by weight unless otherwise indicated. All ranges are inclusive and combinable in any order except where it is clear that such numerical ranges are constrained to add up to 100%.

A wide variety of metal electroplating baths may be used with the present invention. Metal electroplating baths typically contain a source of metal ions, an electrolyte, and a polymeric leveling agent including as polymerized units an ethyleneically unsaturated nitrogen-containing heterocyclic monomer. Optionally, the electroplating baths may contain one or more of accelerators, suppressors, sources of halide ions, grain refiners and mixtures thereof. Other additives may also be suitably used in the present electroplating baths.

Typical sources of metal ions are any metal compounds that are soluble in the electroplating bath. Suitable metal compounds include, but are not limited to, inorganic and organic metal salts such as metal sulfate, copper persulfate, metal halide, metal chlorate, metal perchlorate, metal alkanesulfonate such as metal methanesulfonate, metal alkanol sulfonate, metal arylsulfonate, metal fluoroborate, metal nitrate, metal acetate, metal citrate and metal gluconate. Exemplary metals include, without limitation, copper, tin, silver, gold, bismuth, nickel, zinc, iridium and antimony. In one embodiment, the source of metal ions is a source of copper ions. In a further embodiment, the source of metal ions is copper sulfate. Mixtures of metal compounds containing the same metal or different metals may be used. Exemplary mixtures of metals include, but are not limited to, copper-tin, copper-tin-bismuth, tin-bismuth, tin-copper-silver, tin-silver, and copper-silver. Such mixtures of metal compounds provide deposits of metal alloys. Such sources of metal ions are generally commercially available.

The source of metal ions may be used in the present electroplating baths in a relatively wide concentration range. Typically, the metal ion source is present in an amount sufficient to provide an amount of metal ions of 1 to 100 g/L in the plating bath. More typically, the source of metal ions provides 10 to 80 g/L of metal ions in the plating bath.

The electrolyte may be alkaline or acidic and is typically acidic. Any acid which is compatible with the metal compound may be used in the present invention. Suitable acids include, but are not limited to: sulfuric acid, acetic acid, fluoroboric acid, nitric acid, sulfamic acid, phosphoric acid, hydrogen halide acids such as hydrochloric acid, alkanesulfonic acids and arylsulfonic acids such as methanesulfonic acid, toluenesulfonic acid, phenolsulfonic acid and benzenesulfonic acid, and halogenated acids such as trifluoromethylsulfonic acid and haloacetic acid such as trifluoroacetic acid. Typically the acid is sulfuric acid, alkanesulfonic acid or arylsulfonic acid. Mixtures of acids may be used. In general, the acid is present in an amount sufficient to impart conductivity to the electroplating bath. The pH of the acidic electrolyte of the present invention has a value of less than 7, and typically less than 2. Exemplary alkaline electroplating baths use pyrophosphate as the electrolyte, although other electrolytes may be employed. It will be appreciated by those skilled in the art that the pH of the electrolyte may be adjusted if necessary by any suitable methods.

The total amount of acid electrolyte used in the present electroplating baths may be from 0 to 200 g/L, and typically from 0 to 120 g/L, although higher amounts of acid may be used for certain applications, such as up to 225 g/L or even 300 g/L. It will be appreciated by those skilled in the art that by using metal sulfate, a metal alkanesulfonate or a metal arylsulfonate as the metal ion source, an acidic electrolyte can be obtained without any added acid.

In general, the metal electroplating baths also contain water. The water may be present in a wide range of amounts. Any type of water may be used, such as distilled, deionized or tap.

Polymeric leveling agents of the present invention include as polymerized units an ethyleneically unsaturated nitrogen-containing heterocyclic monomer. Such leveling agents may further include as polymerized units a cross-linking agent. Optionally, the leveling agent may further include as polymerized units a (meth)acrylate monomer. In yet a further embodiment, the present leveling agent includes a sulfur-containing group.

Ethyleneically unsaturated nitrogen-containing heterocyclic monomers and their thio-analogs useful in the present invention include, without limitation: vinylpyridines such as 2-vinylpyridine or 4-vinylpyridine; lower alkyl ($C_1$-$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines. In one embodiment, the ethyleneically unsaturated nitrogen-containing heterocyclic monomer is aromatic.

Suitable cross-linking agents useful in the present invention include di-, tri-, tetra-, or higher ethyleneically unsaturated monomers. Examples of cross-linking agents useful in the present invention include, but are not limited to: trivinylbenzene, divinyltoluene, divinylpyridine, divinylnaphthalene, divinylxylene, ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propyleneglycol dimethacrylate, propyleneglycol diacrylate, trimethylolpropane trimethacrylate, divinyl benzene, glycidyl methacrylate, 2,2-dimethylpropane 1,3diacrylate, 1,3-butylene glycol diacrylate, 1,3-butylene glycol dimethacrylate, 1,4-butanediol diacrylate, diethylene glycol diacrylate, diethylene glycol diacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly (vinyl hydro siloxane), poly(phenyl vinyl siloxane) and mixtures thereof. An ethyleneically unsaturated nitrogen-containing heterocyclic cross-linking agent may be used as the ethyleneically unsaturated nitrogen-containing heterocyclic monomer in the present polymeric leveling agents.

The polymeric leveling agents of the present invention may optionally contain additional monomers, such as, but not limited to: (meth)acrylic acid, (meth)acrylamides, alkyl (meth)acrylates, alkenyl (meth)acrylates, aryl (meth)acrylates, vinyl aromatic monomers, substituted ethylene monomers, and mixtures thereof. In one embodiment, the polymeric leveling agent includes a (meth)acrylate monomer as polymerized units.

Suitable alkyl (meth)acrylates include without limitation $(C_1$-$C_{24})$alkyl (meth)acrylates. Examples of alkyl (meth)acrylates include, but are not limited to: methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate, 2-ethylhexyl acrylate, 2-ethylhexyl methacrylate, isodecyl methacrylate, and mixtures thereof.

The (meth)acrylate monomers acrylamide and alkyl (meth)acrylate monomers useful in the present invention may optionally be substituted. Suitable substituted (meth)acrylate monomers include, but are not limited to: hydroxy$(C_2$-$C_6)$ alkyl (meth)acrylates such as 2-hydroxyethyl methacrylate, 2-hydroxyethyl acrylate and 2-hydroxypropyl methacrylate; dialkylamino$(C_2$-$C_6)$-alkyl (meth)acrylates such as dimethylaminoethyl methacrylate and dimethylaminoethyl acrylate; dialkylamino$(C_2$-$C_6)$alkyl (meth)acrylamides such as N,N-dimethylaminoethyl methacrylamide and N,N-dimethylaminopropyl methacrylamide; $(C_1$-$C_6)$alkoxysilyl (meth)acrylate; $(C_1$-$C_6)$alkylsilyl (meth)acrylate; and mixtures thereof.

The vinylaromatic monomers useful in the present invention include, but are not limited to: styrene, α-methylstyrene, vinyltoluene, p-methylstyrene, ethylvinylbenzene, vinylnaphthalene, vinylxylenes, and mixtures thereof. The vinylaromatic monomers may be substituted, where one or more hydrogens are replaced with one or more substituent groups, such as but not limited to, halogen, nitro, cyano, alkyl, alkoxy, carboxy, and amino.

Other suitable monomers include alkylene oxide monomers and particularly alkylene oxide-containing (meth)acrylate monomers. Exemplary alkylene oxide monomers include, but not limited to, poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. The poly(ethylene oxide/propylene oxide) monomers useful in the present invention may be linear, block or graft copolymers. Such monomers typically have a degree of polymerization of from about 1 to about 50, and preferably from about 2 to about 50. Leveling agents of the present invention that also contain an alkylene oxide monomer may also function as suppressors.

In one embodiment, the leveling agents of the invention may optionally include a sulfur-containing group. Such sulfur-containing group may be present as polymerized units of an ethyleneically unsaturated sulfur-containing monomer, or incorporated as part of a polymerization chain transfer agent. Suitable polymerization chain transfer agents include alkyl mercaptans.

The leveling agents of the invention may be copolymers or homopolymers and more typically are copolymers. In general, the polymeric leveling agents include as polymerized units 1 to 100 wt % of a nitrogen-containing heterocyclic monomer, more typically from 5 to 90 wt %, and still more typically from 10 to 75 wt %. Such leveling agents generally include as polymerized units 0 to 99 wt % of a monomer that is not a nitrogen-containing heterocyclic monomer. Typically, such non-nitrogen-containing heterocyclic monomers are present as polymerized units in the leveling agents in an amount from 10 to 95 wt %, and more typically from 25 to 90 wt %. The molecular weight of the polymeric leveling agents is typically in the range of 1,000 to 1,000,000, preferably 5,000 to 500,000, and more preferably 10,000 to 100,000. The polydispersity of these materials is in the range of 1 to 20, preferably 1.001 to 15, and more preferably 1.001 to 10.

The present polymeric leveling agents may be prepared by a variety of methods known in the art. For example, such leveling agents may be prepared by solution polymerization, such as that disclosed in U.S. Pat. No. 6,903,175 (Gore et al.) and U.S. Pat. No. 5,863,996 (Graham), or by emulsion polymerization, such as that disclosed in U.S. Pat. No. 6,420,441 (Gallagher et al.) and U.S. Pat. No. 6,787,601 (Lamola et al.).

The solution polymerized leveling agents are prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and tert-butanol.

The solution polymerized leveling agents may be prepared by first charging a solvent heel or alternatively a mixture of solvent and some portion of the monomer mixture to a reaction vessel equipped with a stirrer, a thermometer and a reflux condenser. The monomer mixture is typically composed of monomer (including optional cross-linker), initiator and chain transfer agent, as appropriate. The solvent or solvent/monomer mixture heel is heated with stirring under a nitrogen blanket to a temperature from 55 to 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

The emulsion polymers useful in the present invention may be prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from 55 to 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from 55 to 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

The leveling agents may be prepared using anionic polymerization or free radical polymerization. In one embodiment, the polymerization is free radical. Initiators useful in the free radical polymerization include, but are not limited to: peroxyesters such as tert-butyl peroctoate, dialkylperoxides and alkylhydroperoxides such as benzoyl peroxide, tert-amyl peroxypivalate and cumene hydroperoxide, persulfates, azoinitiators such as azoisobutylnitrile and 2,2'-azobis(2-methylbutanenitrile), and redox initiators. When such free radical initiators are used, part of the initiator is incorporated into the polymer as end groups. The amount of the free radical initiator used is typically from 0.05 to 10 wt %, based on the weight of total monomer. It will be appreciated that more than one polymerization initiator may be used.

Chain transfer agents may optionally be used in the polymerization reactions to prepare the present polymeric leveling agents. Suitable chain transfer agents include, but are not limited to: alkyl mercaptans such as dodecyl mercaptan, and aromatic hydrocarbons with activated hydrogens such as toluene. Such optional chain transfer agents are typically added to the monomer feed.

When a cross-linker is used to prepare the polymeric leveling agents, then upon completion of the polymerization reaction, either solution or emulsion polymerization, the reaction mixture contains a plurality of cross-linked polymer particles. Such particles may be used in solution or isolated by any suitable means. These polymer particles typically have a mean particle size of 0.5 to 1000 nm. In one embodiment, the leveling agent is a cross-linked polymer.

The amount of polymeric leveling agents used in the present metal electroplating baths will depend upon the particular leveling agents selected, the concentration of the metal ions in the electroplating bath, the particular electrolyte used, the concentration of the electrolyte and the current density applied. In general, the total amount of leveling agents in the electroplating bath is from 0.5 ppm to 10,000 ppm based on the total weight of the plating bath, although greater or lesser amounts may be used. Typically, the total amount of leveling agents is from 1 to 5000 ppm and more typically from 5 to 1000 ppm.

A wide variety of accelerators may be employed in the present metal electroplating baths. Such accelerators may be used alone or as a mixture of two or more. In one embodiment, when the electroplating bath is a copper electroplating bath the accelerator is a disulfide-containing accelerator. In general, the disulfide-containing accelerators have a molecular weight of 5000 or less and more typically 1000 or less. Disulfide-containing accelerators that also have sulfonic acid groups are generally preferred, particularly compounds that include a group of the formula $R'—S—S—R—SO_3X$, where R is an optionally substituted alkyl, optionally substituted heteroalkyl, optionally substituted aryl group, or optionally substituted heteroalicyclic; X is hydrogen or a counter ion such as sodium or potassium; and R' is hydrogen or an organic residue, such as a group of the formula $—R—SO_3X$ or a substituent of a larger compound. Alkyl groups typically have from 1 to 16 carbons, and more typically 1 to 12 carbons. Heteroalkyl groups will have one or more hetero (N, O or S) atoms in the chain, and typically have from 1 to 16 carbons, and more typically 1 to 12 carbons. Carbocyclic aryl groups include, but are not limited to, phenyl and naphthyl. Heteroaromatic groups are also suitable aryl groups, and typically contain 1 to 3 of one or more of N, O and S atoms and 1 to 3 separate or fused rings and include, e.g., coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, and benzothiazol. Heteroalicyclic groups typically will have 1 to 3 of one or more of N, O and S atoms and from 1 to 3 separate or fused rings and include, e.g., tetrahydrofuranyl, thienyl, tetrahydropyranyl, piperdinyl, morpholino, and pyrrolindinyl. Substituents of substituted alkyl, heteroalkyl, aryl or heteroalicyclic groups include, e.g., $C_{1-8}$ alkoxy; $C_{1-8}$ alkyl; halogen; cyano; and nitro.

More specifically, useful disulfide-containing accelerators include those of the following formulae: $XO_3S—R—S—S—R—SO_3X$ and $XO_3S—Ar—S—S—Ar—SO_3X$, wherein R is an optionally substituted alkyl group, and typically is an alkyl group having from 1 to 6 carbon atoms and more typically from 1 to 4 carbon atoms; Ar is an optionally substituted aryl group such as optionally substituted phenyl or naphthyl; and X is hydrogen or a suitable counter ion such as sodium or potassium. Exemplary disulfide-containing accelerators include, without limitation, bis-sulfopropyl disulfide and bis-sodium-sulfopropyl disulfide.

In another embodiment, accelerators that do not contain a disulfide group may be used. Such accelerators include, without limitation, sulfur-containing accelerators and contain one or more sulfur atoms and may be, thiols, mercaptans, sulfides and organic sulfonic acids. In one embodiment, such accelerator compound has the formula $XO_3S—R—SH$, wherein R is an optionally substituted alkyl group, and typically is an alkyl group having from 1 to 6 carbon atoms and more typically from 1 to 4 carbon atoms; and X is hydrogen or a suitable counter ion such as sodium or potassium. Exemplary sulfur-containing accelerators include, without limitation, N,N-dimethyl-dithiocarbamic acid-(3-sulfopropyl)ester; 3-mercapto-propylsulfonic acid-(3-sulfopropyl)ester; 3-mercaptopropylsulfonic acid (sodium salt); carbonic acid-dithio-o-ethylester-s-ester with 3-mercapto-1-propane sulfonic acid (potassium salt); 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Other suitable accelerators are described in U.S. Pat. Nos. 3,770,598; 4,374,709; 4,376,685; 4,555,315; and 4,673,469.

When used, the optional accelerator may be used in a wide range of amounts depending upon the particular metal plating bath, the particular accelerator chosen and the plating process used. Such selection of accelerator amount is well within the ability of those skilled in the art. Typically, the accelerator is present in an amount of 0.1 to 3000 ppm. When a disulfide-containing accelerator is used in a freshly prepared copper electroplating bath, the amount of such accelerator is typically from 0.1 to 1000 ppm. More typically, the disulfide-containing accelerator compound is present in an amount of from 0.5 to 300 ppm, still more typically from 1 to 100 ppm, and even more typically from 2 to 50 ppm. If a mixture of accelerators is used, each accelerator may be used in the amounts described for the disulfide-containing accelerators.

Any suppressor may optionally be used in the present electroplating baths. Suitable suppressors include polymeric materials, preferably having heteroatom substitution, particularly oxygen linkages. Typically, suppressors are polyethers, such as, but not limited to, those of the formula R—O—(CXYCX'Y'O)$_n$H wherein R is hydrogen, aryl, alkyl or alkenyl group containing from 2 to 20 carbons; X, Y, X', and Y' are each independently hydrogen, alkyl, such as methyl, ethyl or propyl, aryl such as phenyl, and aralkyl such as benzyl; and n is an integer from 5 to 100,000. In one embodiment, one or more of X, Y, X' and Y' is hydrogen. More than one suppressor may be used.

Suitable suppressors include, but are not limited to: amines such as ethoxylated amines; polyoxyalkylene amines and alkanol amines; amides; poly-glycol type wetting agents such as polyethylene glycols, polyalkylene glycols and polyoxyalkylene glycols; high molecular weight polyethers; polyethylene oxides such as those having a molecular weight in the range of 1,000 to 100,000; polyoxyalkylene block copolymers; alkylpolyether sulfonates; complexing suppressors such as alkoxylated diamines; and complexing agents for cupric or cuprous ions such as citric acid, edetic acid, tartaric acid, potassium sodium tartrate, acetonitrile, cupreine and pyridine.

Particularly useful suppressors include, but are not limited to: ethyleneoxide/propyleneoxide ("EO/PO") block or random copolymers; ethoxylated polystyrenated phenol having 12 moles of ethyleneoxide ("EO"), ethoxylated butanol having 5 moles of EO, ethoxylated butanol having 16 moles of EO, ethoxylated butanol having 8 moles of EO, ethoxylated octanol having 12 moles of EO, ethoxylated beta-naphthol having 13 moles of EO, ethoxylated bisphenol A having 10 moles of EO, ethoxylated sulfated bisphenol A having 30 moles of EO and ethoxylated bisphenol A having 8 moles of EO.

In general, the suppressor may be added in a wide variety of amounts. Such selection of amounts is well within the ability of those skilled in the art. For copper plating baths, any optional suppressors used are typically present in an amount that provides sufficient lateral growth of the copper layer. Suitably, the amount of suppressor is in the present metal electroplating baths is from 0.001 to 10 g/L, and more typically 0.1 to 2.0 g/L.

Halide ion may optionally be added to the present metal electroplating baths. When the metal plating bath is a copper plating bath, it is preferred that a halide ion is present. Chloride and bromide are preferred halide ions, with chloride being more preferred. Mixtures of halide ions may be used. A wide range of halide ion concentrations (if a halide ion is employed) may be suitably utilized, e.g. from 0 (where no halide ion employed) to 100 ppm of halide ion in the plating bath, more preferably from 25 to 75 ppm. Such halides may be added as the corresponding hydrogen halide acid or as any suitable salt. Such halide ion sources are generally commercially available and may be used without further purification.

The electroplating baths of the present invention may be prepared by combining the components in any order. In one embodiment, the inorganic components such as metal compound, water, electrolyte and optional halide ion source, are first added to a bath vessel followed by the polymeric leveling agents and any other optional organic additives such as accelerators and suppressors.

The plating baths of the present invention may be used at any temperature from 10 to 65° C. or higher. Typically, the temperature of the plating baths is from 10 to 45° C. and more typically from 15 to 35° C.

In general, the present metal electroplating baths are agitated during use. Any suitable agitation method may be used with the present invention and such methods are well-known in the art. Suitable agitation methods include, but are not limited to, air sparging, work piece agitation, impingement and the like. When the present invention is used to plate an integrated circuit substrate, such as a wafer, the wafer may be rotated such as from 1 to 250 revolutions per minute ("RPM") and the plating solution contacts the rotating wafer, such as by pumping or spraying. In the alternative, the wafer need not be rotated where the flow of the plating bath is sufficient to provide the desired metal deposit.

Substrates are electroplated by contacting the substrate with the metal plating baths of the present invention and applying a current density for a period of time to deposit a metal layer on the substrate. The substrate typically functions as the cathode. The plating bath contains an anode, which may be soluble or insoluble. Potential is typically applied to the cathode. Sufficient current density is applied and plating performed for a period of time sufficient to deposit a metal layer, such as a copper layer, having a desired thickness on the substrate. For the plating of copper on an electronic device, suitable current densities, include, but are not limited to, the range of 1 to 250 mA/cm$^2$. Typically, the current density is in the range of 1 to 75 mA/cm$^2$ when the present invention is used to deposit copper in the manufacture of integrated circuits. Other current densities will be useful depending upon the particular metal to be deposited and the particular substrate being plated, the cross-linked polymeric leveling agent selected, as well as other considerations known to those skilled in the art. Such current density choice is within the abilities of those skilled in the art.

The present invention is useful for depositing a metal layer, particularly a copper layer, on a variety of substrates, particularly those having variously sized apertures. Accordingly, the present invention provides a method of depositing a metal layer such as copper on a substrate including the steps of: contacting a substrate to be plated with copper with a copper plating bath; and then applying a current density for a period of time sufficient to deposit a copper layer on the substrate, wherein the copper plating bath includes a source of copper ions, an acid electrolyte and a polymeric leveling agent including as polymerized units an ethylenieically unsaturated nitrogen-containing heterocyclic monomer. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

Metal, particularly copper, is deposited in apertures according to the present invention without substantially forming voids within the metal deposit. By the term "without substantially forming voids", it is meant that >95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit is desired, and where metal filled features that are substantially free of voids are desired. Such processes include printed wiring board and integrated circuit manufacture. For example, the present plating baths may be useful for the plating of vias, pads or traces on a printed wiring board, as well as for bump plating on wafers. Other suitable processes include packaging and interconnect manufacture where suitable substrates include lead frames and interconnects.

An advantage of the present invention is that overplating, particularly mounding, is reduced. Such reduced overplating means less time and effort is spent in removing metal, such as copper, during subsequent chemical-mechanical polishing processes, particularly in semiconductor manufacture. A further advantage of the present invention is that a wide range of apertures sizes may be filled within a single substrate with substantially no suppressed local plating. Thus, the present invention is particularly suitable to substantially filling apertures in a substrate having a variety of aperture sizes, such as from 0.01 μm (or smaller) to 100 μm or even larger. The present leveling agents provide level metal deposits over a wide range of feature sizes, such as 0.18 μm and 2 μm trenches, in a single substrate using the present plating baths. For example, deposits having ≦1500 Å of mounding over dense 0.18 μm features and ≦2000 Å of dishing over 2 μm apertures may be obtained according to the present invention.

Another advantage is that the present electroplating baths provide metal deposits having less surface roughness and higher reflectivity, as measured by atomic force microscopy, as compared to conventional leveling agents. For example, layers of copper deposited from the present plating baths have an arithmetic average roughness ("Ra") of ≦7 nm and preferably <6 nm. Such copper layers typically have a root mean square roughness ("Rs") of approximately 9 nm or less. In addition, these copper layers also have a low Z-value, such as ≦150, typically ≦125 and more typically ≦100. The "Z-value" is the difference in heights in nm of the average of the 10 highest and 10 lowest points examined. The lower the Z-value, the more uniform the surface of the copper layer. Increasing the concentration of the present leveling agents in a copper plating bath tends to increase the roughness of the deposited copper surface, i.e. the Z-value increases.

Electronic devices such as semiconductor devices, semiconductor packages, and printed circuit boards, are formed according to the present invention having substantially planar copper layers and filled features that are substantially free of added defects. By "substantially planar" copper layer is meant that the step height, i.e., the difference between areas of dense very small apertures and areas free of or substantially free of apertures, is less than 1 μm, preferably less than 0.75 μm, more preferably less than 0.6 μm, and even more preferably less than 0.1 μm. "Substantially free of added defects" refers to the leveling agent not increasing the number or size of defects, such as voids, in filled apertures as compared to control plating baths not containing such leveling agent. A further advantage of the present leveling agent is that a substantially planar metal layer may be deposited on a substrate having non-uniformly sized apertures, wherein the apertures are substantially free of added voids. "Non-uniformly sized apertures" refer to apertures having a variety of sizes in the same substrate.

A further advantage of the present invention is that a range of impurities can be selectively incorporated into the metal layer, particularly a copper layer, as deposited. A particular advantage of the present leveling agents is that little doping of impurities may be observed in the copper layer up to the initial 1000 Å, or even up to the initial 1500 Å, of copper deposited. This allows for the filling of vias ("gap filling") with a very pure copper deposit (≦15 ppm of average total impurities) in a dual damascene process used in integrated circuit manufacture. After the initial 1000 Å or so, the current density is typically increased in order to fill wide metal lines. Impurities are then incorporated in the copper deposit in such wide metal lines at an amount of ≧50 ppm total average impurities. Thus, the present invention provides limited doping of narrow lines (vias) and controlled doping of wide lines, providing a wiring structure having reduced resistivity in narrow metal lines and reduced void formation in wide metal lines under the narrow metal lines. A composition is provided by this invention which includes a source of copper ions, an electrolyte, and a leveling agent, wherein the leveling agent is capable of providing a first copper deposit in <130 nm apertures of a substrate and a second copper deposit in >130 nm apertures, where the first copper deposit has <20 ppm of total impurities and the second copper deposit has >50 ppm of total impurities. Further, a method of depositing copper on a substrate is provided including the steps of: contacting a substrate having <130 nm apertures and >130 nm apertures with a plating bath including a source of copper ions, an electrolyte and a leveling agent; and applying a potential to the substrate using direct current to deposit a copper layer of a desired thickness, wherein copper deposited in the <130 nm apertures has <20 ppm of total impurities and the copper deposited in the >130 nm apertures has >50 ppm of total impurities.

The range of average amounts of such impurities incorporated in the copper layer as deposited, that is before annealing, may be from 1 to 500 ppm for each impurity, such as chloride, sulfur, carbon, oxygen and nitrogen. The total of the average amounts of impurities before annealing may be up to a 10,000 ppm, or even greater. In one embodiment, such total of the average amounts of impurities is in the range of from 1 to 5000 ppm, more typically from 1 to 1000 ppm. The impurity levels are determined by Secondary Ion Mass Spectrometry ("SIMS"), which provides a value of ion concentration per unit area, as compared to an ion implanted standard. The average impurity values are obtained by summing the ppm values from the SIMS analysis for each data point for each impurity and then dividing by the total number of data points for the depth (in nm) of the copper layer evaluated. The average impurity levels throughout the depth of the copper deposit are much lower than the individual values. For example, an impurity level of chloride ion by SIMS analysis may show a maximum value of 200 ppm for a given unit area, where the average chloride ion impurity level may only be 5 ppm for the entire copper deposit.

In integrated circuit manufacture, copper layers are typically annealed. During such annealing step, certain impurities, such as sulfur and oxygen, are typically reduced. Copper layers deposited according to the present invention, following annealing, typically have average total impurities in the range of 1 to 1000 ppm, more typically 1 to 700 ppm, and still more typically from 1 to 500 ppm.

Impurity levels in the metal deposit are related to the concentration of the present leveling agents in the metal plating bath, the particular nitrogen-containing heterocyclic monomer used to prepare the polymeric leveling agent, the molecular weight of the leveling agent and the amount of the nitrogen-containing heterocyclic monomer units within the polymeric leveling agent. Increasing the concentration of the present leveling agents in the metal plating bath results in an increase in the average impurity levels in the metal deposit. Likewise, decreasing the concentration of the present leveling agents results in a decrease in the average impurity levels in the metal deposit. Increasing each or both of the molecular weight of the leveling agent and the level of the nitrogen-containing monomer in the polymeric leveling agent increases the level of impurities incorporated into the metal deposit. The desired average level of impurities in a metal deposit can thus be achieved by selecting a desired concentration of the present polymeric leveling agents in the metal plating bath or by selecting a polymeric leveling agent that has an appropriate amount of cross-linking agent or molecular weight.

Alternatively, a desired average amount of impurities in a metal deposit can be achieved by the use of a mixture of a leveling agent of the present invention and a conventional leveling agent. Exemplary leveling agents that may be used in admixture with the present leveling agents are any suitable leveling agent for use in a metal plating bath. In one embodiment, such conventional leveling agents are reaction products of an amine or a cyclic amine such as imidazole with an epoxide, such as epichlorohydrin or butanediol diglycidyl ether. When used in a mixture, the present cross-linked leveling agents and the conventional (i.e. non-cross-linked) leveling agents may be present in any suitable ratio by weight, such as from 1:99 to 99:1. Using such a mixture of leveling agents provides a further advantage in that the roughness of the deposited copper surface can be reduced, i.e. the Z-value is lowered, while achieving a desired level of impurity incorporation in the deposited film. Suitable additional leveling agents to be used in admixture include those disclosed in U.S. Pat. Nos. 4,038,161 and 6,610,192. When mixtures of cross-linked polymeric leveling agents are used, they may be present in a wide range of ratios by weight, such as from 1:99 to 99:1.

The following examples are expected to illustrate various aspects of the invention.

EXAMPLE 1

A cross-linked polymeric leveling agent was prepared by mixing butyl acrylate ("BA", 40 wt %), acrylic acid ("AA", 10 wt %), vinyl imidazole ("VI", 40 wt %), trimethylolpropane triacrylate ("TMPTA", 10 wt %) and a peroxide initiator (tert-amyl peroxypivalate) in a vessel cooled in an ice bath. The mixture was then pumped into a heated reactor containing iso-propanol alcohol as solvent. The reaction was controlled at 80° C. for approximately 2 hours. The iso-propanol alcohol was then removed by vacuum evaporation and the product was washed with water to provide an approximately 33% aqueous solution of a cross-linked polymer (BA/AA/VI/TMPTA) having an approximate weight average molecular weight ("Mw") of 77,000, based on gel permeation chromatography against appropriate standards, and a number average molecular weight ("Mn") of 1400.

EXAMPLE 2

The procedure of Example 1 was repeated except that the following monomers and amounts were used: hydroxyethyl methacrylate ("HEMA", 50 wt %), VI (40 wt %), and TMPTA (10 wt %).

EXAMPLES 3-4

The procedure of Example 2 was repeated using the following ratios of monomers.

| Example | Wt % HEMA | Wt % VI | Wt % TMPTA |
|---|---|---|---|
| 3 | 40 | 50 | 10 |
| 4 | 30 | 60 | 10 |

EXAMPLES 5-17

The procedure of Example 1 is repeated except the following monomers are used in the ratios shown and are expected to produce cross-linked polymeric leveling agents.

| Example | Monomer 1 (wt %) | Monomer 2 (wt %) | Monomer 3 (wt %) | Cross-linker (wt %) |
|---|---|---|---|---|
| 5  | BA (35)    | AA (25)    | VI (25)   | DEGDMA (15) |
| 6  | HEMA (30)  | MAA (10)   | VPy (30)  | DVB (10) |
| 7  | HPMA (25)  | AA (10)    | VP (50)   | EGDMA (15) |
| 8  | MA (20)    | AA (15)    | VI (55)   | TMPTA (10) |
| 9  | EHA (37)   | MAA (12)   | VPip (50) | TMPTMA (11) |
| 10 | EHA (35)   | VMor (55)  | —         | DEGDMA (10) |
| 11 | HEA (40)   | VI (48)    | —         | ALMA (12) |
| 12 | HEA (40)   | AA (25)    | MVP (30)  | TMPTA (5) |
| 13 | HEMA (45)  | AA (25)    | —         | DVP (30) |
| 14 | BA (50)    | VP (15)    | MVP (15)  | EGDMA (10) |
| 15 | HEMA (65)  | —          | —         | DVP (35) |
| 16 | BA (45)    | AA (10)    | VI (45)   | — |
| 17 | HEMA (50)  | AA (10)    | VI (40)   | — |

The abbreviations in the above table have the following meanings:
HPMA = hydroxypropyl methacrylate;
MA = methyl acrylate;
EHA = ethylhexylacrylate;
HEA = hydroxyethyl acrylate;
MAA = methacrylic acid;
VMor = vinyl morpholine;
VP = 2-vinyl pyridine;
VPy = vinyl pyrrole;
VPip = vinyl piperidine;
MVP = methyl vinyl pyridine;
DEGDMA = diethyleneglycol dimethacrylate;
DVB = divinyl benzene;
EGDMA = ethyleneglycol dimethacrylate;
TMPTMA = trimethylolpropane trimethacrylate;
ALMA = allyl methacrylate; and
DVP = divinyl pyridine.

EXAMPLE 18

A copper plating bath was prepared by combining copper sulfate (40 g/L of copper ion), sulfuric acid (10 g/L), hydrochloric acid (50 mg/L of chloride ion), a disulfide-containing sulfonic acid accelerator (10 mL/L), an EO/PO copolymer suppressor (5 mL/L), the leveling agent from Example 1 (3 mL/L) and water. The accelerator was a disulfide compound having sulfonic acid groups and a molecular weight of <1000. The suppressor was an EO/PO copolymer having a molecular weight of <5,000.

A layer of copper was electroplated onto a wafer substrate having apertures by contacting a spinning wafer (200 RPM) with the above plating bath at 25° C. Copper plating was using direct current and the following 3-step waveform: 7 mA/cm² followed by 10 mA/cm² the features and then 59 mA/cm². After copper deposition, the wafers were rinsed and dried. Copper was deposited to approximately 1 μm. The copper deposits were then analyzed by Secondary Ion Mass Spectrometry ("SIMS") for total impurity levels and found to contain oxygen, nitrogen, chlorine, sulfur and carbon as impurities. The average amounts of impurities (C, N, O, S, Cl) in the copper deposit at 4000 Å depth were as follows: Cl=380 ppm; S=80 ppm; C=310 ppm; N=10 ppm and O=15 ppm. The total amount of average impurities at this depth was 795 ppm. The average amounts of impurities after the first 1000 Å of copper deposited were Cl=1 ppm, S=1 ppm, C=6 ppm, and N=5 ppm and the average total impurity level for the first 1000 Å of deposition was 13 ppm.

EXAMPLES 19-20

The procedure of Example 18 was repeated except that the amount of the leveling agent used was increased. In Example 17, 4 mL/L of leveling agent was used and in Example 18, 5 mL/L of leveling agent was used. The average amount of impurities at 4000 Å were determined and are reported in the following table.

| Example | Cl (ppm) | S (ppm) | C (ppm) | N(ppm) | O (ppm) | Total (ppm) |
|---|---|---|---|---|---|---|
| 19 | 480 | 95 | 310 | 10 | 15 | 910 |
| 20 | 600 | 100 | 400 | 10 | 15 | 1125 |

The above data clearly show that increasing the concentration of the cross-linked polymeric leveling gent in the copper plating bath also increase the total average amounts of impurities in the copper deposit.

EXAMPLES 21-26

The procedure of Example 18 was repeated, except that the amount of the leveling agent from Example 1 was varied. A mixture of leveling agents was used in certain samples. The approximate total of average impurities (Cl, S, C, N and O) in a 1 μm copper deposit was determined according to the procedure in Example 16 and the results are reported in the following table. "Leveling Agent 1" is the leveling agent from Example 1. "Leveling Agent 2" is a 1:1 reaction product of imidazole with butanediol diglycidyl ether having a weight average molecular weight of approximately 4000.

| Example | Leveling Agent 1 (ppm) | Leveling Agent 2 (ppm) | Approximate Total Average Impurity Level (ppm) |
|---|---|---|---|
| 21 | 10 | 0 | 1100 |
| 22 | 8 | 0 | 900 |
| 23 | 6 | 0 | 800 |
| 24 | 4 | 5 | 450 |
| 25 | 2 | 5 | 250 |
| 26 | 0 | 5 | <50 |

The above data clearly show that decreasing amounts of the present leveling agents in a copper plating bath provide decreasing levels of average total impurity levels in the copper deposit. Also, desired levels of impurities can be obtained by blending the present leveling agents with other leveling agents.

EXAMPLES 27-28

The procedure of Example 1 was repeated except that the monomers and amounts listed in the following table were used. The molecular weights are also reported.

| Example | BA (wt %) | VI (wt %) | AA (wt %) | TMPTA (wt %) | Mw | Mn |
|---|---|---|---|---|---|---|
| 27 | 45 | 45 | 10 | 0 | 680 | 500 |
| 28 | 20 | 60 | 10 | 10 | 530 | 400 |

EXAMPLE 29

A copper plating bath was prepared containing 40 g/L copper ion (from copper sulfate), 10 g/L sulfuric acid, 50 ppm of chloride ion, 10 mL/L of a disulfide-containing sulfonic acid accelerator, 5 mL/L of an EO/PO copolymer suppressor, water, and a leveling agent from Examples 1, 27 or 28. Blanket wafers were plated with copper using a DC waveform ramping to a current density of 60 mA/cm². After copper deposition, the wafers were rinsed and dried. Copper was deposited to approximately 1 μm. The plated copper films were analyzed using atomic force microscopy to evaluate the surface roughness. The results are reported in the following table.

| Sample | Leveling Agent Example | Leveling Agent Amount (ppm) | Ra (nm) | Rs (nm) | Z (nm) |
|---|---|---|---|---|---|
| A | 1 | 8 | 5.3 | 6.7 | 77 |
| B | 27 | 6 | 6.3 | 8.1 | 70 |
| C | 28 | 6 | 6.4 | 8.1 | 65 |

These copper plating baths were also used to deposit copper on wafers having dense 0.18 μm apertures and isolated 2.0 μm lines. In each sample, the apertures and lines were filled with copper and a substantially planar copper surface was observed. Slight mounding was observed over the dense apertures as follows: Sample A: 1300 Å; Sample B: 1080 Å; and Sample C: 630 Å. Slight dishing was observed over the isolated wide lines as follows: Sample A: 1430 Å; Sample B: 1740 Å; and Sample C: 1960 Å.

What is claimed is:

1. A composition comprising a source of metal ions, an electrolyte, and a polymeric leveling agent comprising as polymerized units an ethyleneically unsaturated nitrogen-containing heterocyclic monomer and a (meth)acrylate monomer, the polymeric leveling agent is included in the composition in amounts of 0.5 ppm to 10.000 ppm.

2. The composition of claim 1 wherein the metal of the metal ions is copper.

3. The composition of claim 1 wherein the ethyleneically unsaturated nitrogen-containing heterocyclic monomer is aromatic.

4. The composition of claim 3, where the ethyleneically unsaturated nitrogen-containing heterocyclic monomer is vinyl imidazole.

5. The composition of claim 1, wherein the (meth)acrylate monomer is chosen from one or more poly(ethylene glycol) (meth)acrylates and poly(ethylene glycol) alkyl ether (meth)acrylates.

6. A method of depositing a metal on a substrate comprising the steps of: contacting the substrate with the composition of claim 1; and applying a current density for a period of time to deposit a metal layer on the substrate.

7. The method of claim 6 wherein the substrate is an electronic device.

* * * * *